US 11,574,795 B2

(12) United States Patent
Watakabe

(10) Patent No.: US 11,574,795 B2
(45) Date of Patent: Feb. 7, 2023

(54) CHARGED PARTICLE BEAM APPARATUS AND SETTING ASSISTING METHOD

(71) Applicant: JEOL Ltd., Tokyo (JP)

(72) Inventor: Kazutaka Watakabe, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 17/380,124

(22) Filed: Jul. 20, 2021

(65) Prior Publication Data

US 2022/0028654 A1    Jan. 27, 2022

(30) Foreign Application Priority Data

Jul. 21, 2020 (JP) .............................. JP2020-124584

(51) Int. Cl.
*H01J 37/28* (2006.01)
*H01J 37/22* (2006.01)
*H01J 37/244* (2006.01)

(52) U.S. Cl.
CPC ............ *H01J 37/28* (2013.01); *H01J 37/222* (2013.01); *H01J 37/244* (2013.01); *H01J 2237/24475* (2013.01); *H01J 2237/2815* (2013.01)

(58) Field of Classification Search
CPC .. H01J 37/00; H01J 37/02; H01J 37/26; H01J 37/28; H01J 37/222; H01J 37/22; H01J 37/244; H01J 37/256; H01J 37/265; H01J 2237/24475; H01J 2237/2815; H01J 2237/2485
USPC .......................................... 250/306, 307, 311
See application file for complete search history.

(56) References Cited

U.S. PATENT DOCUMENTS

| 4,894,541 A | 1/1990 | Ono | |
|---|---|---|---|
| 5,412,210 A * | 5/1995 | Todoroko | ................ H01J 37/28 850/16 |
| 9,625,398 B1 * | 4/2017 | Campbell | .......... G01N 23/2252 |

FOREIGN PATENT DOCUMENTS

| JP | 63231249 A | 9/1988 |
|---|---|---|
| JP | S6416905 A | 1/1989 |
| JP | 6435838 A | 2/1989 |
| JP | 231146 A | 2/1990 |
| JP | 11237348 A | 8/1999 |
| JP | 200239976 A | 2/2002 |
| JP | 200262270 A | 2/2002 |
| JP | 2004163135 A | 6/2004 |
| JP | 2005114384 A | 4/2005 |
| JP | 2006275756 A | 10/2006 |
| JP | 2013143364 A | 7/2013 |

OTHER PUBLICATIONS

Extended European Search Report issued in EP21186424.4 dated Jan. 7, 2022.

(Continued)

*Primary Examiner* — Jason L McCormack
(74) *Attorney, Agent, or Firm* — The Webb Law Firm

(57) ABSTRACT

A UI image includes a reference image, which includes a background image and a schematic image. The background image corresponds to a cross section of a specimen having a multilayer structure. The schematic image includes a figure indicating an electron penetration depth, a figure indicating a characteristic X-ray generation depth, and a figure indicating a back-scattered electron generation depth. These figures are displayed in an overlapping manner or in parallel to each other.

9 Claims, 8 Drawing Sheets

(56) References Cited

OTHER PUBLICATIONS

Brundle et al., Real-time simulation for x-ray microanalysis, Solid State Technology, Mar. 1996, vol. 39, No. 3, pp. 105-110.
Schlangen et al., Non destructive 3D chip inspection with nano scale potential by use of backside FIB and backscattered electron microscopy, Microelectronics Reliability, 2007, vol. 47, pp. 1523-1528.
Zhao and Darwin, Quantitative Backscattered Electron Analysis Techniques for Cement-Based Materials, A Report on Research Sponsored by The Air Force Office of Scientific Research, 1990, pp. 1-57.
Drouin et al., A Fast and Easy-to-use Modeling Tool for Scanning Electron Microscopy and Microanaylsis Users, Scanning, 2007, vol. 29, pp. 92-101.
Ng et al., Metallic thin film depth measurements by X-ray microanalysis, Applied Surface Science, 2006, vol. 252, pp. 3972-3976.
Office Action issued in JP2020124584 dated Jun. 7, 2022.

\* cited by examiner

FIG. 3

| ELEMENT | ATOMIC NUMBER (Z) | MASS (A) | DENSITY ($\rho$) | MINIMUM EXCITATION ENERGY (Ec) | ... |
|---|---|---|---|---|---|
| **** | **** | **** | **** | **** | ... |
| **** | **** | **** | **** | **** | ... |
| **** | **** | **** | **** | **** | ... |
| ⋮ | ⋮ | ⋮ | ⋮ | ⋮ | ⋮ |

CHARGED PARTICLE BEAM APPARATUS AND SETTING ASSISTING METHOD

CROSS REFERENCE TO RELATED APPLICATION

This application claims priority to Japanese Patent Application No. 2020-124584 filed Jul. 21, 2020, the disclosure of which is hereby incorporated by reference in its entirety.

BACKGROUND OF THE INVENTION

Field of the Invention

The present disclosure relates to a charged particle beam apparatus and a method of assisting setting, and in particular to a technique to assist setting of an illumination condition.

Description of Related Art

As charged particle beam apparatuses, there are known a scanning electron microscope, an electron beam microanalyzer, an ion beam illumination apparatus, and the like. In the following, a scanning electron microscope will be described as a representative apparatus of these charged particle beam apparatuses.

A scanning electron microscope is an apparatus in which an electron beam which is a charged particle beam is illuminated onto a specimen, and secondary electrons, back-scattered electrons, characteristic X-rays, or the like emitted from the specimen are detected. An image representing a surface or a surface layer of the specimen is formed based on a sequence of detection signals acquired by two-dimensional scanning of the electron beam. With an analysis of the characteristic X-rays emitted from the specimen, a qualitative analysis and a quantitative analysis of the specimen are executed.

In a measurement of the specimen by the scanning electron microscope, an electron penetration depth (an electron beam penetration depth, an electron scattering depth) in the specimen changes depending on an element forming the specimen, and the electron penetration depth in the specimen also changes depending on an accelerating voltage (landing voltage) of the electron beam. Similarly, a depth in the specimen at which the back-scattered electrons are generated (a generation range of back-scattered electrons emitted from the specimen), and a depth in the specimen at which the characteristic X-rays are generated (a generation range of the characteristic X-rays emitted from the specimen) change depending on the element forming the specimen and the accelerating voltage of the electron beam.

In the scanning electron microscope, an illumination condition such as the accelerating voltage is set by designation of a numerical value by a user. In the related art, during setting of the illumination condition, there is no display of a schematic diagram or the like for assisting a setting operation. There is also known a simulation apparatus which estimates an electron scattering range or a signal generation range in the specimen. However, such an apparatus is not a measurement apparatus, and functions as a single entity, and there has been no cooperation between such an apparatus and the charged particle beam apparatus.

JP 2004-163135 A and JP 2006-275756 A disclose X-ray analysis apparatuses. These patent documents disclose calculation of an X-ray generation region in the specimen, and determination of the accelerating voltage based on the X-ray generation region. However, these patent documents do not disclose a technique for assisting the setting of the illumination condition by the user.

JP S64-16905 A discloses an X-ray analysis apparatus in which a thickness of a thin film in a specimen can be determined by illuminating an electron beam onto the specimen and detecting an X-ray emitted from the specimen. JP 2013-143364 A discloses a charged particle beam apparatus which identifies an internal structure of a specimen by illuminating an electron beam onto the specimen and detecting an X-ray emitted from the specimen. However, these documents do not disclose calculation of a signal generation range in a specimen having a multilayer structure. In particular, these documents do not disclose a model in which the electron beam penetrates partway to one of the layers of the specimen. In the present disclosure, the concept of the setting of the illumination condition may include processes to check and change the illumination condition.

An advantage of the present disclosure lies in assisting setting of an illumination condition by a user. Alternatively, an advantage of the present disclosure lies in enabling, in a charged particle beam apparatus, setting of an illumination condition while imagining a physical phenomenon which occurs in a specimen having a multilayer structure.

SUMMARY OF THE INVENTION

According to one aspect of the present disclosure, there is provided a charged particle beam apparatus comprising: a calculator that calculates a depth of a physical phenomenon which extends in a depth direction in a specimen having a multilayer structure, according to a condition of illumination of a charged particle beam onto the specimen; a generator that generates a reference image having a background image indicating the multilayer structure and a schematic image indicating the depth of the physical phenomenon, based on the depth of the physical phenomenon; and a display that displays the reference image when an actual illumination condition of the charged particle beam is set.

According to another aspect of the present disclosure, there is provided a method of assisting setting, the method comprising: calculating a depth of a physical phenomenon which extends in a depth direction in a specimen having a multilayer structure, according to a condition of illumination of a charged particle beam onto the specimen; generating a reference image having a background image indicating the multilayer structure and a schematic image indicating the depth of the physical phenomenon, based on the depth of the physical phenomenon; and displaying the reference image.

BRIEF DESCRIPTION OF THE DRAWINGS

Embodiment(s) of the present disclosure will be described based on the following figures, wherein:

FIG. 3 is a diagram showing an example of an element table;

DESCRIPTION OF THE INVENTION

Figure 1:
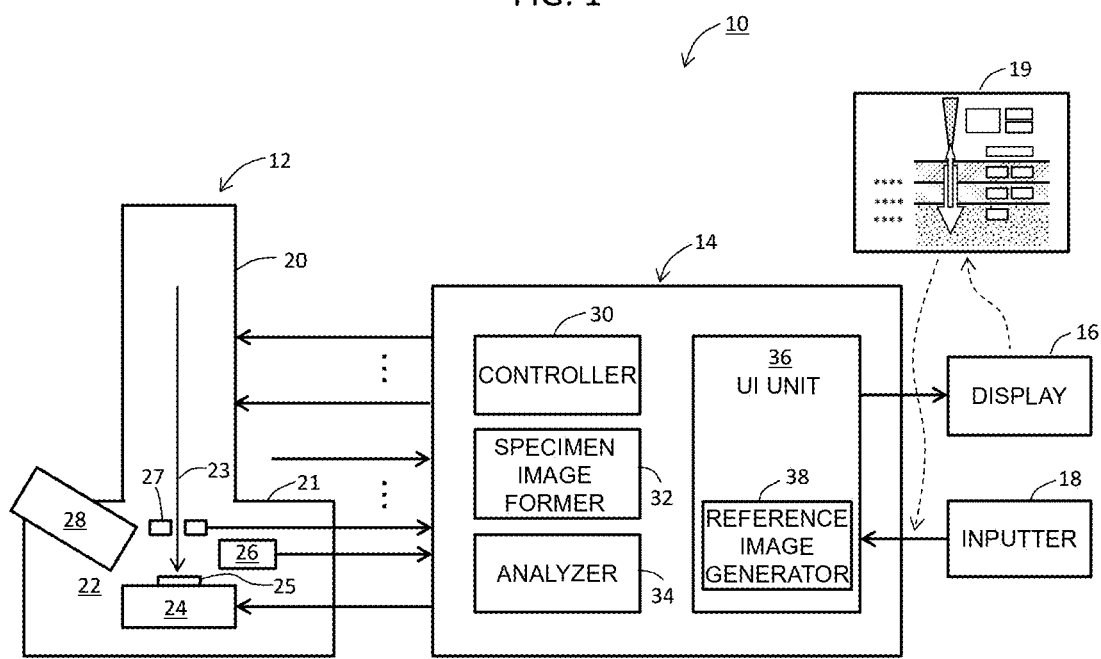
FIG. 1 is a conceptual diagram showing a scanning electron microscope according to an embodiment of the present disclosure.

An embodiment of the present disclosure will now be described with reference to the drawings.

(1) Overview of Embodiment

A charged particle beam apparatus according to an embodiment of the present disclosure comprises a calculator, a generator, and a display. The calculator calculates a depth of a physical phenomenon which extends in a depth direction in a specimen having a multilayer structure, according to a condition of illumination of a charged particle beam onto the specimen. The generator generates a reference image based on the depth of the physical phenomenon. The reference image has a background image indicating the multilayer structure, and a schematic image indicating the depth of the physical phenomenon. The reference is displayed on the display when an actual illumination condition of the charged particle beam is set.

According to the structure described above, it becomes possible to set an actual illumination condition while imagining a depth (depth range) of a physical phenomenon which extends in a depth direction in a specimen, through observation of the reference image. In particular, because the reference image includes a background image and a schematic image, the depth where the physical phenomenon occurs can be predicted while imagining the inside of the specimen. Even for users with poor knowledge of the charged particle beam or the charged particle beam apparatus, appropriate setting of the actual illumination condition can be facilitated through the observation of the reference image.

Even when the schematic image is only a rough estimate, with the above-described structure, it is possible to assist the setting of the actual illumination condition by the user, in comparison to a case where no information is provided to the user. In an embodiment of the present disclosure, a graphical user interface image including the reference image is provided to the user, and processes to check and to change the illumination condition are executed through this image.

In an embodiment of the present disclosure, the background image includes n layer images (wherein n is an integer greater than or equal to 2) indicating n layers arranged in the depth direction in the specimen. A display width of each of the layer images in the depth direction is determined according to a thickness of each of the layers. When a total number of layers forming the specimen is N, n is less than or equal to N. A value for n may be designated by a user. A thickness of each layer is designated by a user or is automatically determined according to a specimen analysis result. Alternatively, the display width of each of the layer images may be calculated from an actual thickness of each of the layers, according to a display scale. When, for calculation purpose, a large value or infinity is set as a thickness of an nth layer (the deepest layer to be displayed), a default value may be set as the display width of an nth layer image.

In an embodiment of the present disclosure, the schematic image includes a figure indicating the depth of the physical phenomenon and which extends in the depth direction. The schematic image is displayed in an overlapping manner over the background image. According to this structure, it becomes possible to intuitively understand to what layer the physical phenomenon extends; that is, to what layer the observation target layers are present. As a figure, an arrow mark may be employed. The penetration of the charged particle beam may be represented by a downward arrow mark, and the signal generation may be represented by an upward arrow mark. A range of the physical phenomenon may be represented by another figure, or the range of the physical phenomenon may be represented as a colored range.

In an embodiment of the present disclosure, the calculator calculates an electron penetration depth and a signal generation depth as the depth of the physical phenomenon. The schematic image includes a figure indicating the electron penetration depth, and a figure indicating the signal generation depth. The figure indicating the electron penetration depth and the figure indicating the signal generation depth are displayed in an overlapping manner or in parallel to each other. According to this structure, it become possible to simultaneously visually identify the electron penetration depth and the signal generation depth. The illumination condition such as the accelerating voltage can be set with this knowledge.

In an embodiment of the present disclosure, when a deepest layer to which the charged particle beam reaches is a kth layer (wherein k is an integer greater than or equal to 2), the calculator calculates the depth of the physical phenomenon based on an accelerating voltage of the charged particle beam, a total thickness of a first layer to a (k−1)th layer in the specimen, and a composition of each of the layers from the first layer to the kth layer. Here, k is less than or equal to n (k≤n). As described above, infinity may be set as the thickness of the kth (or nth) layer.

In an embodiment of the present disclosure, the physical phenomenon is penetration of an electron beam which is the charged particle beam. First, the calculator identifies a kth layer (wherein k is an integer greater than or equal to 2), which is a deepest layer to which the electron beam reaches, by checking presence or absence of transmission of the electron beam for each layer in an order from a first layer to deeper layers. Next, the calculator calculates a total thickness of the first layer to the deepest layer. Then, the calculator calculates an in-layer penetration depth of the electron beam in the kth layer. Finally, the calculator adds the in-layer penetration depth to the total thickness, to calculate an electron penetration depth in the specimen as the depth of the physical phenomenon.

In an embodiment of the present disclosure, the physical phenomenon is generation of a signal caused by illumination of an electron beam which is the charged particle beam. First, the calculator identifies a kth layer (wherein k is an integer greater than or equal to 2), which is a deepest layer in which an escape signal is generated, by checking presence or absence of escaping of the signal from the specimen for each layer in an order from a first layer to deeper layers. Next, the calculator calculates a total thickness of the first layer to a (k−1)th layer. Then, assuming the escaping of the signal from the specimen, the calculator calculates an in-layer generation depth of the signal in the kth layer. Finally, the calculator adds the in-layer generation depth to the total thickness, to calculate a signal generation depth in the specimen as the depth of the physical phenomenon. In an embodiment of the present disclosure, the signal is at least one of a back-scattered electron or a characteristic X-ray.

A method of assisting setting according to an embodiment of the present disclosure comprises a first step, a second step, and a third step. In the first step, a depth of a physical phenomenon which extends in a depth direction in a specimen having a multilayer structure is calculated according to a condition of illumination of a charged particle beam onto the specimen. In the second step, a reference image is generated based on the depth of the physical phenomenon. The reference image has a background image indicating the multilayer structure and a schematic image indicating the depth of the physical phenomenon. In the third step, the reference image is displayed.

Along with the reference image or as a part of the reference image, a numerical value indicating the illumination condition, a numerical value indicating a thickness of each layer, a label indicating a composition of each layer, or the like may be displayed. When each layer is formed from a plurality of elements, a dominant representative element may be selected for each layer, or the plurality of elements may be taken into consideration for each layer.

The above-described method of assisting the setting may be realized by a function of software. In this case, a program executing the method of assisting the setting is installed via a network or a transportable recording medium into a charged particle beam apparatus, an information processor, or the like.

(2) Details of Embodiment

FIG. 1 shows a charged particle beam apparatus according to an embodiment of the present disclosure. The charged particle beam apparatus is specifically a scanning electron microscope 10. In the illustrated example configuration, the scanning electron microscope 10 may primarily be separated into a measurement unit 12 and an information processor 14. The information processor 14 is formed from, for example, a personal computer (PC). A display 16 and an inputter 18 are connected to the information processor 14.

As will be described later, specimen information and an illumination condition are input through an image 19 displayed on the display 16. In addition, a physical phenomenon which occurs in a specimen when an electron beam is illuminated onto the specimen is schematically displayed on the display 16.

The measurement unit 12 comprises a lens barrel 20 and a body 21. An inside of the body 21 is a specimen chamber 22. In the lens barrel 20, an electron beam source, a focusing lens, a deflection scanning lens, an objective lens, or the like is provided. An electron beam 23 is generated by these constituting elements. In the specimen chamber 22, a specimen stage 24 is provided, and a specimen 25 is held by the specimen stage 24. Specifically, a specimen holder holding the specimen 25 is attached to the specimen stage 24. The specimen stage 24 has an XYZ mechanism which moves the specimen 25 in up-and-down and left-and-right directions, a rotational mechanism which rotates the specimen 25, and a tilt mechanism which inclines the specimen 25. A specimen inclination angle is also called a tilt angle.

The specimen 25 has a multilayer structure. During the measurement of the specimen 25, normally, the tilt angle of 0° is employed, but alternatively, another tilt angle may be set.

In the illustrated example structure, a secondary electron detector 26, a back-scattered electron detector 27, and a characteristic X-ray spectrometer 28 are provided at a periphery of the specimen 25. These constituting elements are schematically represented. When the electron beam 23 is illuminated onto the specimen 25, secondary electrons and back-scattered electrons are emitted from the specimen 25, and a characteristic X-ray is emitted from the specimen 25. With the secondary electron detector 26, the secondary electrons emitted from the specimen 25 are detected. With the back-scattered electron detector 27, the back-scattered electrons emitted from the specimen 25 are detected. With the characteristic X-ray spectrometer 28, the characteristic X-ray emitted from the specimen 25 is detected.

The characteristic X-ray spectrometer 28 is, for example, an energy-dispersive characteristic X-ray spectrometer. In place of or in addition to the energy-dispersive characteristic X-ray spectrometer, a wavelength-dispersive characteristic X-ray spectrometer may be provided. Alternatively, a detector other than those described above may be provided. Normally, the electron beam 23 is two-dimensionally scanned with respect to the specimen 25. A plurality of detection signals which are output from the secondary electron detector 26, the back-scattered electron detector 27, and the characteristic X-ray spectrometer 28 are sent to the information processor 14.

The information processor 14 includes a processor which executes an information process, a memory which stores data and a program, or the like. In FIG. 1, a plurality of representative functions realized by the information processor 14 are represented by a plurality of blocks. Specifically, the information processor 14 functions as a controller 30, a specimen image former 32, an analyzer 34, a UI (user interface) unit 36, or the like.

The controller 30 controls operations of various devices in the measurement unit 12. With the controller 30, a plurality of operation parameters for realizing an illumination condition designated by the user are determined. The illumination condition includes an accelerating voltage of the electron beam 23. The accelerating voltage of the electron beam 23 may also be called a landing voltage of the electron beam 23, from the viewpoint of the specimen 25.

The specimen image former 32 forms a two-dimensional image representing a surface or a surface layer of the specimen 25 based on a sequence of detection signals (for example, a sequence of secondary electron detection signals or a sequence of back-scattered electron detection signals) acquired by the two-dimensional scanning of the electron beam 23. The analyzer 34 executes a qualitative analysis and a quantitative analysis of the specimen 25 based on the detection signal which is output from the characteristic X-ray spectrometer 28. Specifically, the analyzer 34 has a function to analyze a plurality of elements forming the specimen and a concentration of each element. Alternatively, a composition may be analyzed for each layer forming the specimen.

The UI unit 36 generates a graphical user interface (GUI) image provided to the user, and receives information which is input by the user through the GUI image. The UI unit 36 has a reference image generator 38.

The reference image generator 38 is a module which generates a reference image. As will be described later in detail, the reference image includes a background image indicating a multilayer structure in the specimen, and a schematic image indicating a plurality of physical phenomena in the specimen. The background image includes a plurality of layer images indicating a plurality of layers forming the specimen, and a plurality of numerical values indicating thicknesses of the plurality of layers. The schematic image includes a plurality of figures indicating ranges of the plurality of physical phenomena and a plurality of numerical values. The reference image forms an important portion of the GUI image. As the physical phenomenon, there may be exemplified electron scattering (electron penetration), and generation of a signal. As the generation of the signal, there may be exemplified generation of back-scattered electrons and generation of characteristic X-rays. The reference image corresponds to a vertical cross section of the specimen.

The reference image or the GUI image including the reference image is a support image for assisting setting of the illumination condition by the user. The user can check or change the illumination condition such as the accelerating voltage through the GUI image while imagining or recognizing, through observation of the GUI image, a range of the physical phenomenon. As described, the UI unit 36 functions as a calculating means, a generation means, and a reception means.

In the example structure illustrated in FIG. 1, the information processor 14 has the UI unit 36, but alternatively, the UI unit 36 may be included in another information processor. For example, a first information processor including the controller 30, and a second information processor including the UI unit 36 may be provided, and these information processors may cooperate with each other.

The display 16 is formed from a liquid crystal display, an organic EL display device, or the like. The inputter 18 is formed from a keyboard, a pointing device, or the like. Alternatively, a display with a touch panel may be provided as the display 16 and the inputter 18.

Figure 2:
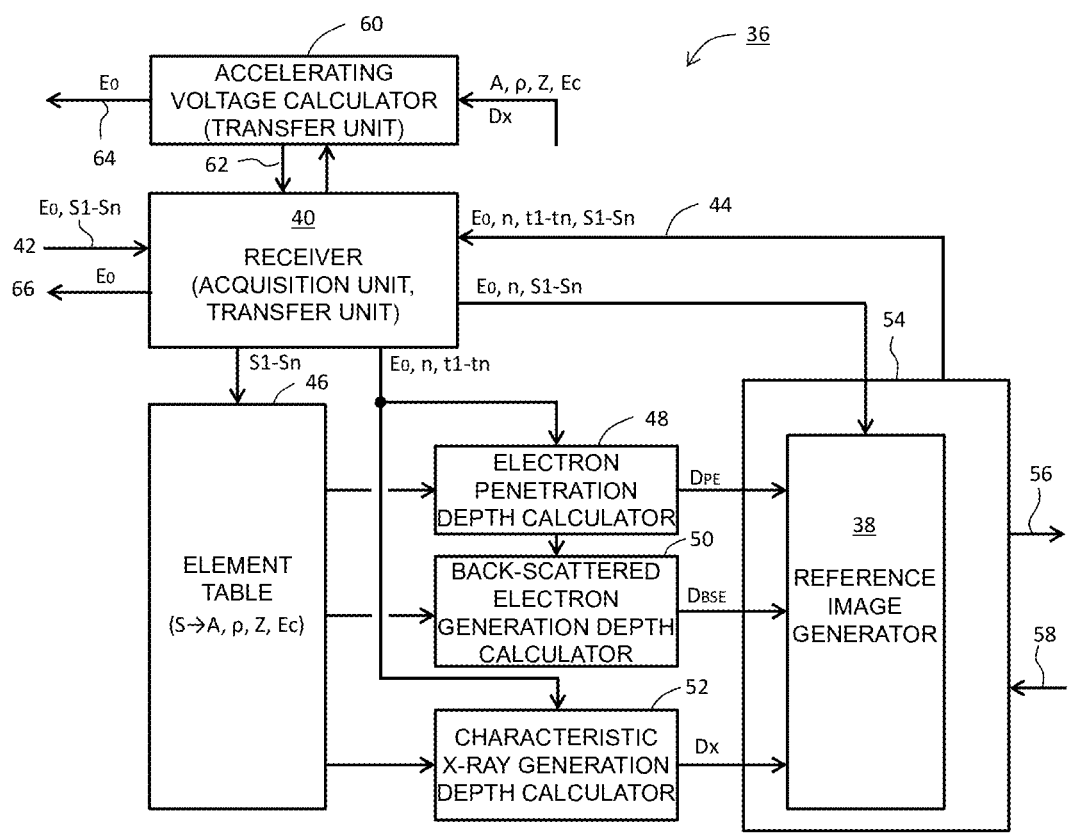
FIG. 2 is a diagram showing an example configuration of a UI (user interface) unit.

FIG. 2 shows an example configuration of the UI unit 36. A plurality of blocks shown in FIG. 2 show functions which are realized by software except for an element table 46. A receiver 40 is a module which receives an accelerating voltage $E_0$ and specimen information. The specimen information includes a number of layers n arranged in the depth direction in the specimen, thicknesses t1~tn of the n layers, and compositions (element information) S1~Sn of the n layers. The parameter n is an integer greater than or equal to 2. When a total number of layers forming the specimen is N, n≤N. A first layer corresponds to an uppermost layer; that is, a surface layer. A deepest layer to which a landing electron reaches is represented as a kth layer, or a deepest layer in which the signal emitted from the specimen is generated is represented as the kth layer. Normally, n is designated to satisfy a condition n≥k.

In a specific example described below, each layer is formed by a single element. In this case, the composition of each layer means an element forming each layer. When each layer is formed from a plurality of elements, each layer may be assumed to be formed from a representative element, or concentrations (weight ratios of the elements) of the plurality of elements forming each layer may be taken into consideration. For example, as a mass, a density, and an atomic number necessary for calculation of each depth, an average mass, an average density, and an average atomic number may be utilized.

As shown by reference numeral 42, the receiver 40 functions as an acquisition unit which acquires from the controller the accelerating voltage $E_0$ which is set in the controller, in response to an operation of the user. In addition, the receiver 40 functions as an acquisition unit which acquires the specimen information from the analyzer. As shown by reference numerals 58 and 44, the receiver 40 has a function to receive the accelerating voltage $E_0$, and the specimen information (n, t1~tn, S1~Sn), which are input by the user through the GUI image.

The receiver 40 also functions as a transfer unit (application unit) which transfers, as an actual illumination condition, the received illumination condition to the controller, to apply the illumination condition to the controller, in response to an operation of the user (refer to reference numeral 66). The illumination condition which is transferred is the accelerating voltage $E_0$.

Specimen information for identifying elements S1~Sn forming the plurality of layers are supplied from the receiver 40 to the element table 46. The element table 46 forms an element database. For each element forming each layer, element information is output from the element table 46. The element information includes a mass A, an atomic number Z, a density ρ, and a minimum excitation energy Ec. The minimum excitation energy Ec corresponds to a minimum energy for generating the characteristic X-ray.

An electron penetration depth calculator 48 calculates an electron penetration depth $D_{PE}$ based on the accelerating voltage $E_0$, and the element information for each layer. A calculation formula for determining the electron penetration depth $D_{PE}$ will be described later. The electron penetration depth $D_{PE}$ is a maximum value of an electron scattering range in the depth direction.

In the present embodiment, a back-scattered electron generation depth calculator 50 calculates a back-scattered electron generation depth $D_{B}S_{E}$ based on the electron penetration depth $D_{PE}$. If necessary, reference may be made to the plurality of the pieces of element information which are output from the element table, for this calculation. A calculation formula for determining the back-scattered electron generation depth $D_{BSE}$ will be described later.

The characteristic X-ray generation depth calculator 52 calculates the characteristic X-ray generation depth $D_X$ based on the accelerating voltage $E_0$ and the element information of each layer. For this calculation, reference is made to the minimum excitation energy, which is one piece of the element information. When a plurality of characteristic X-rays may be generated from one element, the generation depth may be calculated for a representative characteristic X-ray among the plurality of characteristic X-rays, or a plurality of generation depths may be calculated for all of the plurality of characteristic X-rays. Alternatively, a table may be prepared, for automatically determining a representative characteristic X-ray for which the calculation is to be made, according to the accelerating voltage.

An image generator 54 is a module which generates the GUI image, and includes the reference image generator 38. To the reference image generator 38, there are supplied the electron penetration depth $D_{PE}$, the back-scattered electron generation depth $D_{B}S_{E}$, the characteristic X-ray generation depth $D_X$, the accelerating voltage $E_0$, the number of layers n, the thicknesses of the layers t1~t2, and the elements S1~Sn forming each layer. Reference numeral 56 shows a signal which is output to the display. Reference numeral 58 shows a signal from the inputter.

An accelerating voltage calculator 60 is a module which back-calculates the accelerating voltage $E_0$ from the characteristic X-ray generation depth $D_X$ as necessary. For this back calculation, reference is made to the specimen information, and to other information. The back-calculated accelerating voltage $E_0$ is sent to the receiver 40 (refer to reference numeral 62). The back-calculated accelerating voltage E0 is sent to the controller as necessary (refer to reference numeral 64). With this process, the accelerating voltage $E_0$ is applied to the controller; that is, the accelerative voltage $E_0$ is activated.

In the example configuration of FIG. 2, a configuration may be employed in which, in addition to the input of the illumination condition such as the accelerating voltage on the GUI image, the controller may be asked to input the illumination condition. This is a safety measure for the user to more cautiously perform the setting of the illumination condition. In this case also, the GUI image is still an image for assisting the setting of the illumination condition. However, as such a re-input is complicated, in the present embodiment, an application button for activating the input illumination condition is prepared. This function will be described later.

Similar to the related art, processes to newly set the illumination condition, to check the illumination condition, and to change the illumination condition can be executed through a setting image (which does not have the reference image) for setting the illumination condition. Such a setting image is generated by the controller shown in FIG. 1. For example, users having abundant knowledge and experience for the electron beam or the scanning electron microscope may set the illumination condition on the setting image, without going through the display of the GUI image.

FIG. 3 shows an example structure of the element table. The element table 46 is constructed on a nonvolatile memory. The element table 46 has a plurality of records 70 corresponding to a plurality of elements. Each record 70 includes element information for an element 72, and the element information is formed from a plurality of pieces of physical information. The plurality of pieces of physical information specifically include an atomic number 74, a mass 76, a density 78, a minimum excitation energy 80, or the like. As described above, a plurality of minimum excitation energies 80 may be registered corresponding to a plurality of characteristic X-rays for each individual element.

Calculation methods will now be described for the electron penetration depth $D_{PE}$, the back-scattered electron generation depth $D_BS_E$, and the characteristic X-ray generation depth $D_X$.

First, it is assumed that the specimen does not have a multilayer structure and that the specimen is formed from a single layer of a single element. Under these assumptions, the electron penetration depth $D_{PE}$ is calculated through the following Formula (1) which is known in the art.

[Formula 1]

$$D_{PE} = 0.033 \frac{AE_0^{1.7}}{\rho \cdot Z} \quad (1)$$

In Formula (1) described above, A represents a mass of an element (atom), $E_0$ represents the accelerating voltage, $\rho$ represents a density of the element, and Z represents an atomic number. The mass A, the density $\rho$, and the atomic number Z are specified in the element table.

The back-scattered electron generation depth $D_BS_E$ is calculated by the following Formula (2). Specifically, the back-scattered electron generation depth $D_BS_E$ is calculated immediately from the electron penetration depth $D_{PE}$, and as a half of the electron penetration depth $D_{PE}$.

[Formula 2]

$$D_{BSE} = \frac{1}{2} D_{PE} \quad (2)$$

The characteristic X-ray generation depth $D_X$ is calculated by the following Formula (3). Ec represents the minimum excitation energy for a particular electron orbital.

[Formula 3]

$$D_X = 0.033 \frac{A(E_0^{1.7} - E_C^{1.7})}{\rho \cdot Z} \quad (3)$$

On the other hand, when the specimen has a multilayer structure, an energy $E_i$ necessary for the electron beam to transmit through an ith layer is represented by the following Formula (4), which is another form of Formula (1). For the purpose of simplifying the explanation, a configuration is assumed in which each layer is formed from a single element. A parameter $t_i$ indicates a thickness of the ith layer. A mass $A_i$, a density $\rho_i$, and an atomic number $Z_i$ are respectively a mass, a density, and an atomic number of the atom forming the ith layer.

[Formula 4]

$$E_i = \left[ \frac{t_i \cdot \rho i \cdot Zi}{0.033 \cdot Ai} \right]^{\frac{1}{1.7}} \quad (4)$$

In the transmission of each layer, the energy defined by Formula (4) described above is consumed. Therefore, an energy $E_k$ of the electron landing the ith layer can be represented by the following Formula (5).

[Formula 5]

$$E_k = E_0 - \sum_{i=1}^{k-1} E_i \quad (5)$$

A first term in Formula (5) is the accelerating voltage $E_0$, and a second term in Formula (5) represents a total energy necessary for the landing electron to transmit through the first layer to the (k−1)th layer.

According to Formula (5), a sign of the energy $E_x$ is checked along the depth direction in an order from the first layer to deeper layers, and a layer in which the energy $E_x$ first becomes negative is the deepest layer to which the landing electron reaches. When the deepest layer is the kth layer, a layer immediately before the deepest layer is represented as the (k−1)th layer. The electron penetration depth (in-layer depth) in the deepest layer; that is, the kth layer, is calculated by substituting the energy $E_x$ of the electron landing the kth layer into the parameter $E_0$ of Formula (3).

The electron penetration depth $D_{PE}$ in the specimen having the multilayer structure is determined by adding the electron penetration depth (in-layer depth) $D_{PEk}$ in the deepest layer to the total thickness of the first layer to the (k−1)th layer.

Formula (6) described below is based on Formula (1), and the in-layer depth $D_{PEk}$ is determined by Formula (6).

[Formula 6]

$$D_{PEk} = 0.033 \frac{AkE_k^{1.7}}{\rho k \cdot Zk} \quad (6)$$

A mass $A_k$, a density $\rho_k$, and an atomic number $Z_k$ are respectively the mass, the density, and the atomic number of the atom forming the kth layer.

In summary, the electron penetration depth $D_{PE}$ in the specimen having the multilayer structure is represented by the following Formula (7).

[Formula 7]

$$D_{PE} = \sum_{i=1}^{k-1} t_i + D_{PEk} \qquad (7)$$

A first term in Formula (7) shows the total thickness from the first layer to the (k−1)th layer, and a second term in Formula (7) shows the in-layer depth $D_{PEk}$ determined by Formula (6). When each layer is formed from a plurality of elements, for example, an average mass, an average density, and an average atomic number may be determined for each layer according to the concentrations of the plurality of elements, and may be substituted into above-described Formulae.

A back-scattered electron generation depth when the specimen has the multilayer structure may also be determined based on a similar idea. However, for the back-scattered electron, the energy consumption in both the landing process (approach process) and the escape process (return process) must be taken into consideration. In other words, an energy which is twice that in the case of the landing electron is consumed. Therefore, a condition (escape condition) to be satisfied for the back-scattered electron generated in the ith layer to escape from the specimen is that an energy $2E_k$ shown by the following Formula (8) does not become negative.

[Formula 8]

$$2E_k = E_0 - \sum_{i=1}^{k-1} 2E_i \qquad (8)$$

A sign of $2E_k$ is checked for each layer along the depth direction from the first layer, and a layer in which the energy $2E_k$ first becomes negative is the deepest layer in which the back-scattered electron emitted from the specimen is generated. When the deepest layer is the kth layer, a layer immediately before the deepest layer is the (k−1)th layer.

A back-scattered electron generation depth (in-layer depth) $D_{BSEk}$ in the deepest layer; that is, the kth layer, is calculated according to Formula (9), which is obtained based on Formulae (1) and (2) described above.

[Formula 9]

$$D_{BSEk} = \frac{1}{2} D_{PEk} = \frac{1}{2} \times 0.033 \frac{A k E_k^{1.7}}{\rho k \cdot Zk} \qquad (9)$$

A back-scattered electron generation depth $D_{BSE}$ in the specimen is calculated based on the following Formula (10).

[Formula 10]

$$D_{BSE} = \sum_{i=1}^{k-1} t_i + D_{BSEk} \qquad (10)$$

That is, a value obtained by adding the in-layer depth $D_{BSEk}$ to the total thickness of the first layer to the (k−1)th layer is set as the back-scattered electron generation depth $D_{BSE}$ in the specimen.

A characteristic X-ray generation depth when the specimen has the multilayer structure may also be determined based on a similar idea. However, it is necessary to consider that the characteristic X-ray is generated only when the energy of the landing electron is greater than the energy for generating the characteristic X-ray, and the characteristic X-ray is not generated when this is not the case.

An energy $E_{k-ck}$ defined by the following Formula (11) is checked for each layer along the depth direction in the order from the first layer.

[Formula 11]

$$E_{k-ck} = E_k - E_{ck} = E_0 - \sum_{i=1}^{k-1} E_i - E_{ck} \qquad (11)$$

In Formula (11), the energy $E_k$ represents the energy of the electron landing the kth layer, which can be determined by Formula (5). In Formula (11), the energy $E_{ck}$ represents the minimum excitation energy in the kth layer. A sign of the energy $E_{k-ck}$ determined by subtracting the energy $E_{ck}$ from the energy $E_k$ is checked for each layer from the first layer. In this process, the layer for which the energy $E_{k-ck}$ first becomes negative is the deepest layer in which the characteristic X-ray is generated. When this layer is the kth layer, a layer immediately before this layer is the (k−1)th layer. The landing electron transmits through the first layer to the (k−1)th layer, and penetrates partway in the kth layer.

A characteristic X-ray generation depth (in-layer depth) $D_{Xk}$ in the kth layer is determined by the following Formula (12), similar to Formula (3).

[Formula 12]

$$D_{Xk} = 0.033 \frac{A(E_k^{1.7} - E_{Ck}^{1.7})}{\rho k \cdot Zk} \qquad (12)$$

The energy $E_k$ of the electron landing the kth layer is determined by Formula (5) described above. The characteristic X-ray generation depth $D_X$ in the specimen having the multilayer structure is determined by the following Formula (13).

[Formula 13]

$$D_X = \sum_{i=1}^{k-1} t_i + D_{Xk} \qquad (13)$$

That is, the characteristic X-ray generation depth $D_X$ in the specimen is determined by adding the in-layer depth $D_{Xk}$ in the kth layer to the total thickness from the first layer to the (k−1)th layer. In the present embodiment, the self-absorption is not taken into consideration. Alternatively, the self-absorption may be taken into consideration. In this case, the self-absorption can be taken into consideration in Formula (11).

When the accelerating voltage $E_0$ is to be back-calculated from the characteristic X-ray generation depth $D_X$ in the specimen having the multilayer structure, the following Formula (14) may be used.

[Formula 14]

$$E_0 = \sum_{i=1}^{k-1} E_i + E_{Xk} \tag{14}$$

In Formula (14), a first term is a total sum of the energies necessary for the electron to transmit through the first layer to the (k−1)th layer, and a second term shows a consumed energy $E_{Xk}$ corresponding to the in-layer depth $D_{Xk}$ in the kth layer. The energy $E_{Xk}$ is determined based on the following Formula (15), which is another form of Formula (12).

[Formula 15]

$$E_{Xk} = \left[\frac{D_{Xk} \cdot \rho_k \cdot Z_k}{0.033 \cdot A_k} + E_C^{1.7}\right]^{\frac{1}{1.7}} \tag{15}$$

Figure 4:
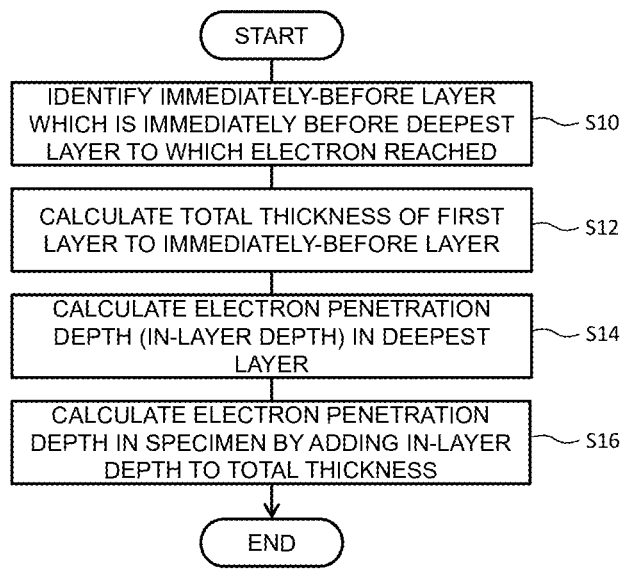
FIG. 4 is a flowchart showing a calculation method of an electron penetration depth.

FIG. 4 shows as a flowchart a calculation method of the electron penetration depth. In S10, the deepest layer (the kth layer) to which the electron reaches is identified, and a layer immediately before this layer (the (k−1)th layer) is identified. In S12, a total thickness from the first layer to the layer immediately before the deepest layer is calculated. In S14, the electron penetration depth (in-layer depth) in the deepest layer is calculated. In S16, the in-layer depth is added to the total thickness, to determine the electron penetration depth in the specimen.

Figure 5:
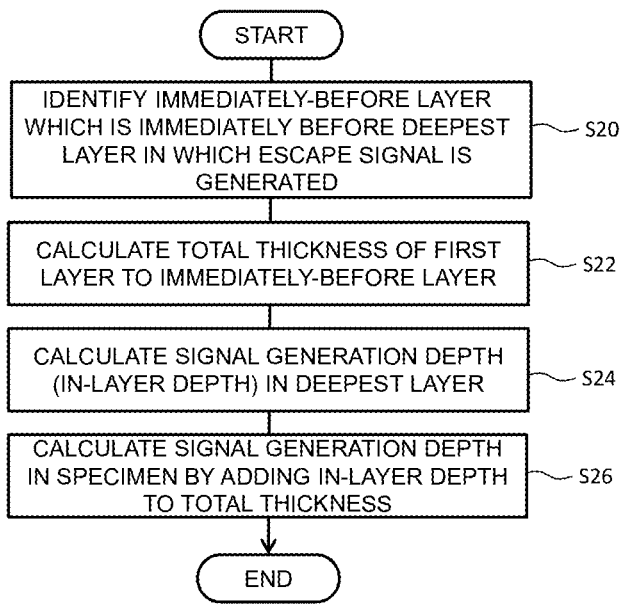
FIG. 5 is a flowchart showing a calculation method of a signal generation depth.

FIG. 5 shows as a flowchart a calculation method of the generation depth of signals such as the characteristic X-ray and the back-scattered electron. In S20, the deepest layer (the kth layer) in which the escape signal is generated is identified, and a layer immediately before this layer (the (k−1)th layer) is identified. In S22, a total thickness from the first layer to the (k−1)th layer is calculated. In S24, the signal generation depth (in-layer depth) in the deepest layer is calculated. In S26, the in-layer depth is added to the total thickness, to determine the signal generation depth in the specimen.

Figure 6:
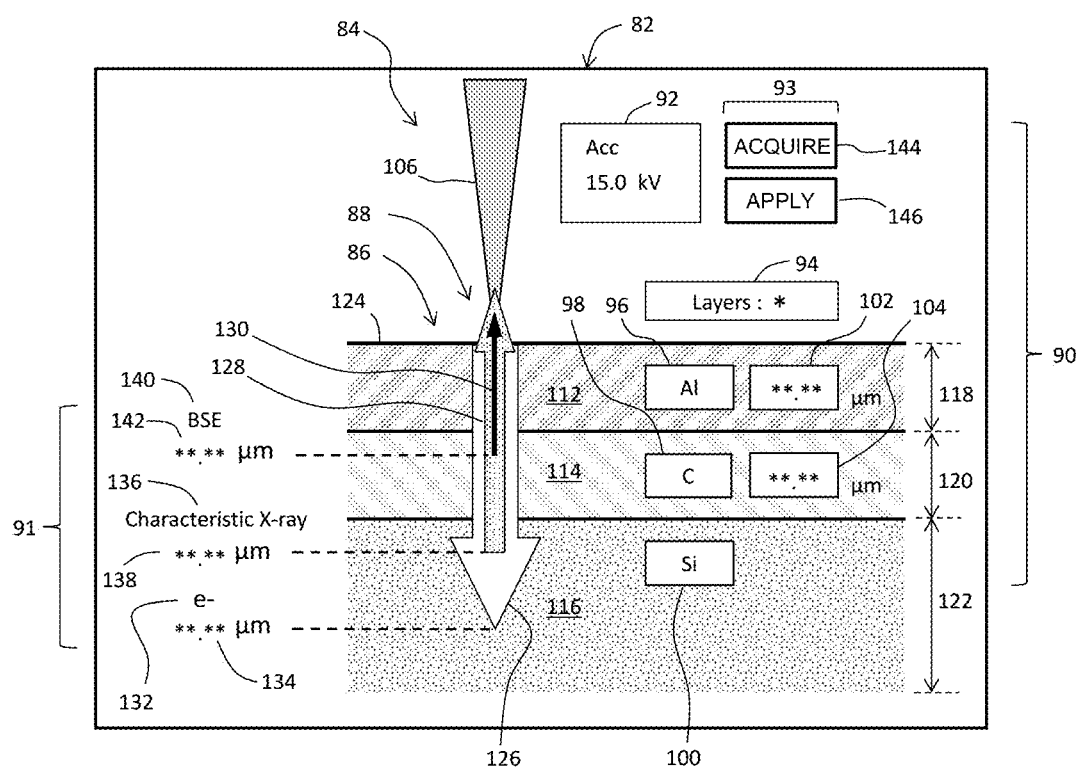
FIG. 6 is a diagram showing a GUI image according to a first configuration.

FIG. 6 shows a UI image 82 according to a first configuration. The UI image 82 may be displayed in place of an original image for setting an illumination condition, or the UI image 82 may be displayed along with such an original image.

The UI image 82 includes a reference image 84 serving as a setting assisting image. The reference image 84 includes a background image 86 and a schematic image 88. The background image 86 corresponds to a cross section of the specimen having the multilayer structure. The schematic image 88 is an image which schematically represents a plurality of physical phenomena which occur in the specimen. From the viewpoint of the functions, the UI image 82 includes an input portion 90 and a numerical value display portion 91.

The input portion 90 includes an accelerating voltage input field 92, a button array 93, a layer number input field 94, element input fields 96~100, thickness input fields 102 and 104, or the like. The accelerating voltage is designated by a user using the accelerating voltage input field 92. The button array 93 includes an acquisition button 144 and an application button 146. When the acquisition button 144 is designated with a pointer and a click operation is performed, the accelerating voltage which is set in the controller is acquired, and is reflected in the accelerating voltage input field 92. When the application button 146 is designated with the pointer and a click operation is performed, the accelerating voltage displayed in the accelerating voltage input field 92 is applied to the controller; that is, the accelerating voltage is activated.

A number of layers of interest in the specimen is designated by the user using the layer number input field 94. When the number of layers is n and a total number of layers in the specimen is N, n≤N. Normally, n is a numerical value greater than or equal to 2. For example, when the specimen is a semiconductor device having a known structure, the number of layers forming the semiconductor device or the number of layers to be observed among the layers is designated by n. In general, when the deepest layer to which the landing electron reaches is anticipated as the kth layer, a numerical value of greater than or equal to k is set as n. Alternatively, n may be changed later based on the contents of the numerical value display portion 91.

Elements forming the layers may be designated using the element input fields 96~100. In this case, a periodic table may be displayed, and an element forming each individual layer may be designated from this table. When each layer is formed from a plurality of elements, a dominant element among these elements may be designated as a representative element.

Alternatively, the plurality of elements forming each layer may be designated. In this case, the average mass, the average density, and the average atomic number are identified for each layer based on the concentration of each element.

Thicknesses of the layers may be designated using the thickness input fields 102 and 104. In the illustrated example configuration, a thickness of the nth layer is set as infinity for the purposes of calculation.

According to the designated number of layers and the thicknesses of the layers, the background image 86 is generated. The background image 86 is formed form n layer images 112, 114, and 116 indicating cross sections of n layers, which are arranged in the up-and-down direction. An upper side 124 of the first layer image 112 showing the first layer corresponds to the specimen surface. Display widths 118 and 120 of the layer images 112 and 114 in the up-and-down direction are determined according to the thicknesses of the first layer and the second layer. That is, the display width of each layer image is converted from an actual thickness of each layer. A conversion condition or a display scale may be determined in advance or determined adaptively. A display width 122 of the layer image 116 in the up-and-down direction is set at a default value. This is because the thickness of the nth layer is set as infinity for the purposes of the calculation. Alternatively, the display scale may be adjusted according to the number of layers. Alternatively, in order to improve a discriminating capability of the layer images 112~116, the layers may be colored. In this case, colors may be selected corresponding to the elements forming the layers.

The schematic image 88 includes figures or shapes 126, 128, and 130, and further includes a figure or shape 106. The figure or shape 106 indicates the electron beam, and is a downward-pointed triangle. An apex thereof coincides with the upper side 124. However, in the example image of FIG. 6, the apex is covered with another figure.

The figure or shape 126 is a downward arrow mark, and indicates the electron penetration depth. More specifically, a lowest point of the figure or shape 126 shows the electron penetration depth (electron penetration range). In determination of a display size of the figure or shape 126, the above-described conversion condition or display scale is applied. In the illustrated example image, the electron scattering extends to a partway position in a third layer.

The figure or shape 128 is an upward arrow mark, and indicates the characteristic X-ray generation depth (characteristic X-ray generation range). More specifically, a lowest point of the figure or shape 128 shows the characteristic X-ray generation depth. In determination of a display size of the figure or shape 128, the above-described conversion condition or display scale is applied. In the illustrated example image, the characteristic X-ray generation depth extends to an upper part of the third layer.

The figure or shape 130 is an upward arrow mark, and indicates the scattered electron generation depth (scattered electron generation range). More specifically, a lowest point of the figure or shape 130 shows the scattered electron generation depth. In determination of a display size of the figure or shape 130, the above-described conversion condition or display scale is applied. In the illustrated example image, the scattered electron generation depth extends to an upper part of a second layer.

By matching the display scale of the figures or shapes 126~130 and the display scale of the layer images 112~116 in the depth direction, it becomes possible to correctly recognize to what layer the electron reaches, and to what layer the depth of the signal generation extends. Based on this recognition, it becomes possible to assess an appropriateness of the accelerating voltage. The accelerating voltage may be changed as necessary, and in this case, the schematic image 88 dynamically changes with the change of the accelerating voltage. Alternatively, the specimen information may be changed, and in this case, the background image 86 and the schematic image 88 change accordingly.

The numerical value display portion 91 is formed from a plurality of numerical values which are displayed. Specifically, the numerical value display portion 91 includes a numerical value 134 indicating the electron penetration depth, a numerical value 138 indicating the characteristic X-ray generation depth, and a numerical value 142 indicating the back-scattered electron generation depth. Further, the numerical value display portion 91 includes a label 132 indicating the electron penetration depth, a label 136 indicating the characteristic X-ray generation depth, and a label 140 indicating the back-scattered electron generation depth. In the illustrated example image, the numerical values 132, 138, and 142 are displayed at approximately the same levels as lower end levels of the figures or shapes 126, 128, and 130, respectively, to clarify the correspondence relationship between the numerical values and the figures.

According to the reference image described above, the range of extension of the physical phenomenon can be intuitively identified in relation to the specimen having the multilayer structure, and the size of the range can be checked as the numerical value. When the specimen is inclined, the background image may be inclined. The depths may be again calculated according to a definition of the depth in the inclined state.

Figure 7:
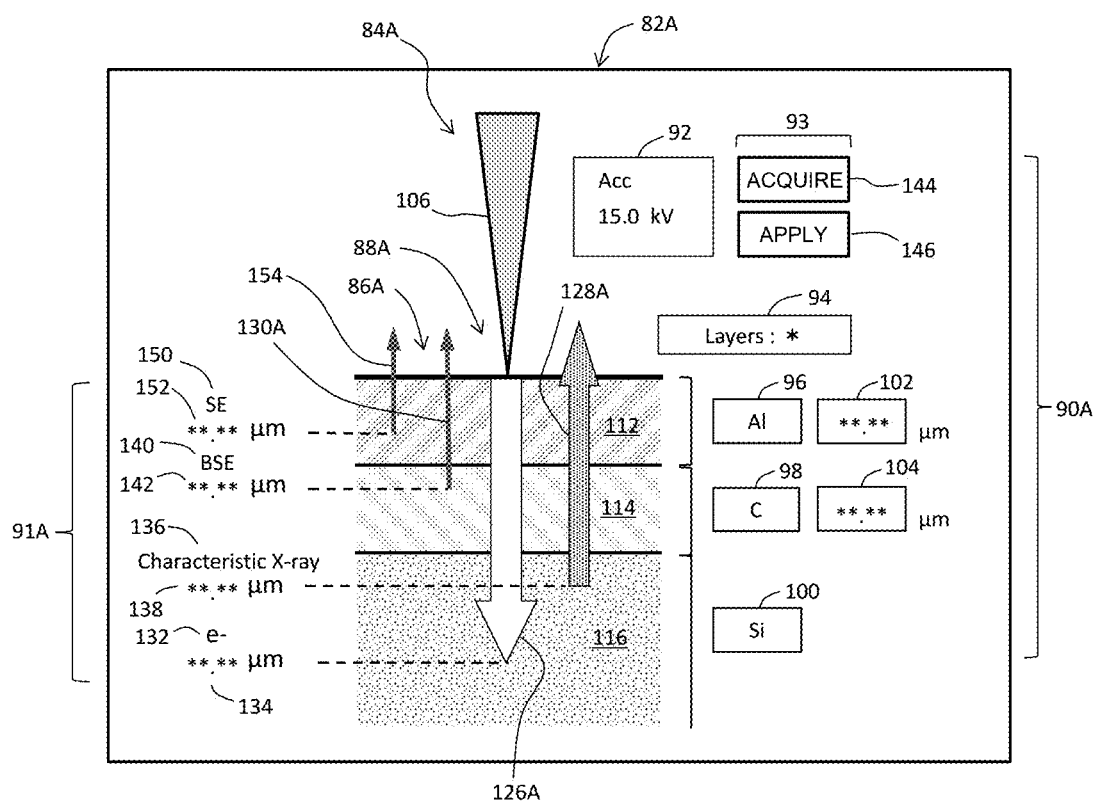
FIG. 7 is a diagram showing a GUI image according to a second configuration.

FIG. 7 shows a UI image 82A according to a second configuration. Elements similar to the elements shown in FIG. 6 are assigned the same reference numerals, and will not be repeatedly described.

The UI image 82A according to the second configuration includes a reference image 84A, and the reference image 84A includes a background image 86A and a schematic image 88A. The UI image 82A includes an input portion 90A and a numerical value display portion 91A. A plurality of the input fields 94~104 are provided at positions deviated to the left from the background image 86A.

The schematic image 88A includes a figure or shape 126A indicating the electron penetration depth, a figure or shape 128A indicating the characteristic X-ray generation depth, and a figure or shape 130A indicating the back-scattered electron generation range. The schematic image 88A further includes a figure or shape 154 indicating the secondary electron generation range. These figures or shapes 126A~130A and 154 are arranged in a horizontal direction, and are not in an overlapping relationship. According to such a display form, visibility of the figures can be improved. An overall shape of the figure or shape 106 indicating the electron beam also appears, so that an illumination point on the specimen is clarified. Because the schematic image 88A does not strictly reproduce the generation of the physical phenomenon, even when the figures are arranged in the left-and-right direction, misunderstanding of the user does not occur, or the possibility of misunderstanding is very small.

Figure 8:
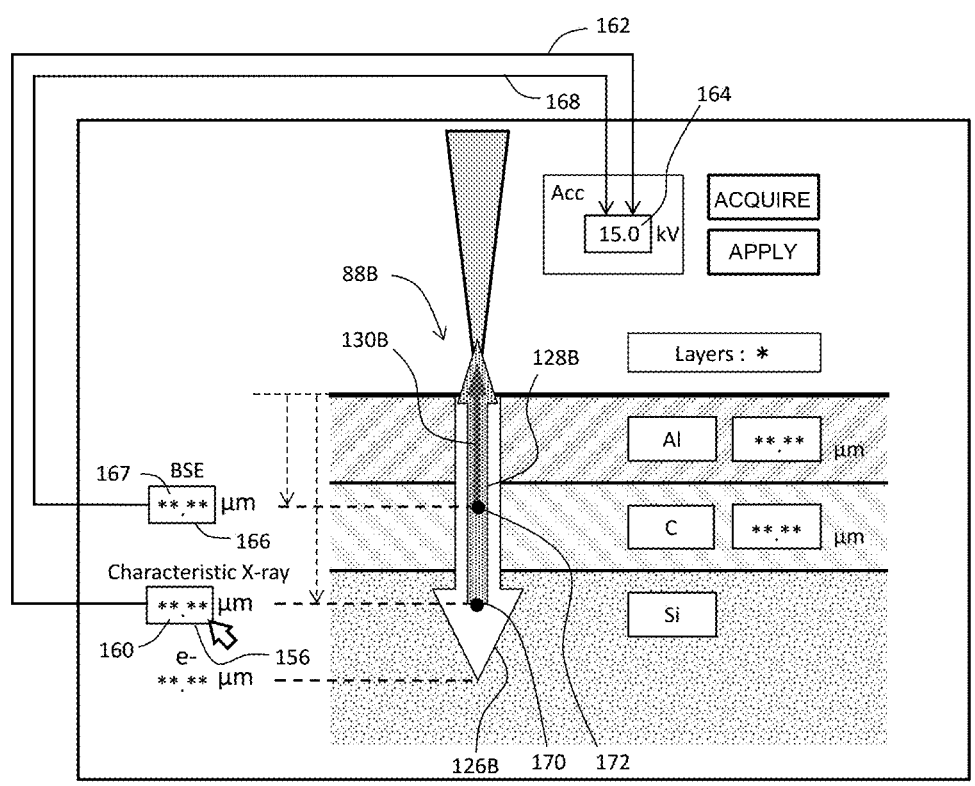
FIG. 8 is a diagram showing a GUI image according to a third configuration.

FIG. 8 shows a UI image according to a third configuration. A schematic image 88B is displayed in an overlapping manner over the background image. The schematic image 88B includes a figure or shape 126B indicating the electron penetration depth, a figure or shape 128B indicating the characteristic X-ray generation depth, and a figure or shape 130B indicating the back-scattered electron generation range, which are displayed in an overlapping manner. In a display field 156, the characteristic X-ray generation depth is displayed as a numerical value 160. The numerical value 160 may be changed by the user. In this case, as shown by reference numeral 162, the accelerating voltage corresponding to the numerical value is back-calculated, and is reflected in an accelerating voltage input field 164. The other depths are also changed accordingly.

Similar to the above, in a display field 166, a numerical value 167 indicating the back-scattered electron generation depth is displayed, and the numerical value 167 may be changed by the user. With such a change, as shown by reference numeral 168, the accelerating voltage corresponding to the numerical value is back-calculated, and is reflected in the accelerating voltage input field 164. The other depths are also changed accordingly.

In place of a direct change of the numerical value 160 and the numerical value 167, a lower end 170 of the figure or shape 128B and a lower end 172 of the figure or shape 130B may be slid in the up-and-down direction with a pointer. With the changing levels of the lower ends 170 and 172, the numerical values 160 and 167 are automatically changed. The accelerating voltage also changes accordingly.

The calculation formula and model described above are merely exemplary, and another calculation formula and another model may be employed. In any case, by providing to the user rough estimates roughly indicating the range of physical phenomenon such as the electron penetration depth, the back-scattered electron generation depth, and the characteristic X-ray generation depth, it becomes possible to improve the convenience for the user or to assist the setting of the illumination condition by the user, in comparison to a case in which none of these pieces of information is provided. In the above-described embodiment, the scanning electron microscope is described, but alternatively, the above-described structures may be applied to other charged particle beam apparatuses.

The invention claimed is:

1. A charged particle beam apparatus comprising:
a calculator configured to calculate a depth of a physical phenomenon which extends in a depth direction in a specimen having a multilayer structure, according to a condition of illumination of a charged particle beam onto the specimen;
a generator configured to generate a reference image having a background image indicating the multilayer structure and a schematic image indicating the depth of the physical phenomenon, based on the depth of the physical phenomenon; and
a display configured to display the reference image when an actual illumination condition of the charged particle beam is set, wherein
the calculator calculates an electron penetration depth and a signal generation depth as the depth of the physical phenomenon, and
the schematic image comprises a figure indicating the electron penetration depth, and a figure indicating the signal generation depth.

2. The charged particle beam apparatus according to claim 1, wherein
the background image comprises n layer images (wherein n is an integer greater than or equal to 2) indicating n layers arranged in a depth direction in the specimen, and
a display width of each of the layer images in the depth direction is determined according to a thickness of each of the layers.

3. The charged particle beam apparatus according to claim 2, wherein
the schematic image comprises a figure indicating the depth of the physical phenomenon and which extends in the depth direction, and
the schematic image is displayed in an overlapping manner over the background image.

4. The charged particle beam apparatus according to claim 1, wherein
the figure indicating the electron penetration depth and the figure indicating the signal generation depth are displayed in an overlapping manner or in parallel to each other.

5. The charged particle beam apparatus according to claim 1, wherein
when a deepest layer to which the charged particle beam reaches is a kth layer (wherein k is an integer greater than or equal to 2), the calculator calculates the depth of the physical phenomenon based on an accelerating voltage of the charged particle beam, a total thickness of a first layer to a (k−1)th layer in the specimen, and a composition of each of the layers from the first layer to the kth layer.

6. The charged particle beam apparatus according to claim 1, wherein
the physical phenomenon is penetration of an electron beam which is the charged particle beam, and the calculator comprises:
a means which identifies a kth layer (wherein k is an integer greater than or equal to 2) which is a deepest layer to which the electron beam reaches, by checking presence or absence of transmission of the electron beam for each layer in an order from a first layer to deeper layers;
a means which calculates a total thickness of the first layer to a (k−1)th layer;
a means which calculates an in-layer penetration depth of the electron beam in the kth layer; and
a means which calculates an electron penetration depth in the specimen as the depth of the physical phenomenon by adding the in-layer penetration depth to the total thickness.

7. The charged particle beam apparatus according to claim 1, wherein
the physical phenomenon is generation of a signal caused by illumination of an electron beam which is the charged particle beam, and
the calculator comprises:
a means which identifies a kth layer (wherein k is an integer greater than or equal to 2) which is a deepest layer in which an escape signal is generated, by checking presence or absence of escaping of the signal from the specimen for each layer in an order from a first layer to deeper layers;
a means which calculates a total thickness of the first layer to a (k−1)th layer;
a means which calculates an in-layer generation depth of the signal in the kth layer assuming the escaping of the signal from the specimen; and
a means which calculates a signal generation depth in the specimen as the depth of the physical phenomenon by adding the in-layer generation depth to the total thickness.

8. The charged particle beam apparatus according to claim 7, wherein
the signal is at least one of a back-scattered electron or a characteristic X-ray.

9. A method of assisting setting, the method comprising:
calculating a depth of a physical phenomenon which extends in a depth direction in a specimen having a multilayer structure, according to a condition of illumination of a charged particle beam onto the specimen;
generating a reference image having a background image indicating the multilayer structure and a schematic image indicating the depth of the physical phenomenon, based on the depth of the physical phenomenon; and
displaying the reference image, wherein
an electron penetration depth and a signal generation depth are calculated as the depth of the physical phenomenon, and
the schematic image comprises a figure indicating the electron penetration depth, and a figure indicating the signal generation depth.

* * * * *